United States Patent
Ishii et al.

(10) Patent No.: US 9,053,904 B2
(45) Date of Patent: Jun. 9, 2015

(54) IMAGE QUALITY ADJUSTING METHOD, NON-TRANSITORY COMPUTER-READABLE RECORDING MEDIUM, AND ELECTRON MICROSCOPE

(71) Applicant: KABUSHIKI KAISHA TOSHIBA, Minato-ku, Tokyo (JP)

(72) Inventors: Takashi Ishii, Yokohama (JP); Akira Hamaguchi, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 264 days.

(21) Appl. No.: 13/764,522

(22) Filed: Feb. 11, 2013

(65) Prior Publication Data

US 2014/0061455 A1  Mar. 6, 2014

(30) Foreign Application Priority Data

Sep. 5, 2012  (JP) .................. 2012-194956

(51) Int. Cl.
*H01J 37/26* (2006.01)
*H01J 37/153* (2006.01)
*H01J 37/28* (2006.01)

(52) U.S. Cl.
CPC .............. *H01J 37/263* (2013.01); *H01J 37/28* (2013.01); *H01J 2237/221* (2013.01); *H01J 2237/24495* (2013.01); *H01J 2237/248* (2013.01)

(58) Field of Classification Search
CPC ..................... G06T 2207/10061; G06T 7/001; G01N 23/225; G01N 21/956; G01N 23/2251; H01J 37/263; H01J 2237/221; H01J 2237/248; H01J 37/28

USPC ......... 250/252.1, 310, 306, 307, 492.22, 311; 382/151

See application file for complete search history.

(56) References Cited

U.S. PATENT DOCUMENTS

| | | | |
|---|---|---|---|
| 2011/0024621 A1* | 2/2011 | Saya .............................. | 250/307 |
| 2013/0094716 A1* | 4/2013 | Carpio et al. ................. | 382/109 |
| 2014/0375793 A1* | 12/2014 | Harada et al. .................. | 348/80 |

FOREIGN PATENT DOCUMENTS

| | | | |
|---|---|---|---|
| JP | 4-328234 A | 11/1992 | |
| JP | 6-068830 A | 3/1994 | |
| JP | 2011-034676 A | 2/2011 | |

OTHER PUBLICATIONS

Japanese Office Action dated Jan. 6, 2015, issued in counterpart Japanese Application No. 2012-194956.

*Primary Examiner* — Nikita Wells

(74) *Attorney, Agent, or Firm* — Holtz, Holtz, Goodman & Chick PC

(57) ABSTRACT

In accordance with an embodiment, a method of adjusting quality of an image of patterns common in shape includes acquiring a first gray value and a first waveform within a reference image, acquiring a sample image, acquiring a second gray value and a second waveform from third and fourth regions within a sample image, respectively, and adjusting the brightness and contrast of the sample image. The first gray value is a standard for the brightness of the image from a first region within a reference image. The first and second waveforms represent a luminance profile of second and fourth regions including edges, respectively. The third and fourth regions correspond to the first and second regions. The brightness and contrast of the sample image are adjusted by matching the first gray value and the first waveform with the second gray value and the second waveform.

20 Claims, 7 Drawing Sheets

IMAGE QUALITY ADJUSTING METHOD, NON-TRANSITORY COMPUTER-READABLE RECORDING MEDIUM, AND ELECTRON MICROSCOPE

CROSS REFERENCE TO RELATED APPLICATIONS

This application is based upon and claims the benefit of priority from the prior Japanese Patent Application No. 2012-194956, filed on Sep. 5, 2012, the entire contents of which are incorporated herein by reference.

FIELD

Embodiments described herein relate generally to an image quality adjusting method, a non-transitory computer-readable recording medium, and an electron microscope.

BACKGROUND

Scanning electron microscopes (hereinafter simply referred to as an "SEM") are widely used to observe the structures of semiconductor devices.

Along with the advances in the miniaturization of wiring lines and the stacking of devices, the number of points (parts) in an observation target where the dimensions are required to be measured and managed has been increasing. Accordingly, there have been demands for an environment where the measured length of an observation image (hereinafter referred to as an "SEM image") acquired by the SEM can be automatically processed in large quantities in a short period of time.

To this end, it is necessary to not only provide image quality adjustment of the whole SEM image but also to provide an image quality reflecting the intention of an analyzer regarding parts that need to be analyzed in the SEM image.

However, when a large quantity of length measurements is conducted, there are slight differences in gray scale and luminance in the boundary of the structure between SEM images acquired from a complex and fine structure of the semiconductor device. Therefore, it is difficult in the present circumstances to automate the length measurement.

DETAILED DESCRIPTION

In accordance with an embodiment, a method of adjusting quality of an image of patterns common in shape includes acquiring a first gray value and a first waveform within a reference image, acquiring a sample image, acquiring a second gray value and a second waveform from third and fourth regions within a sample image, respectively, and adjusting the brightness and contrast of the sample image. The first gray value is a standard for the brightness of the image from a first region within a reference image. The first and second waveforms represent a luminance profile of second and fourth regions including edges, respectively. The third and fourth regions correspond to the first and second regions. The brightness and contrast of the sample image are adjusted by matching the first gray value and the first waveform with the second gray value and the second waveform.

Embodiments will now be explained with reference to the accompanying drawings. Like components are provided with like reference signs throughout the drawings and repeated descriptions thereof are appropriately omitted.

(1) Electron Microscope According to One Embodiment

Figure 1:
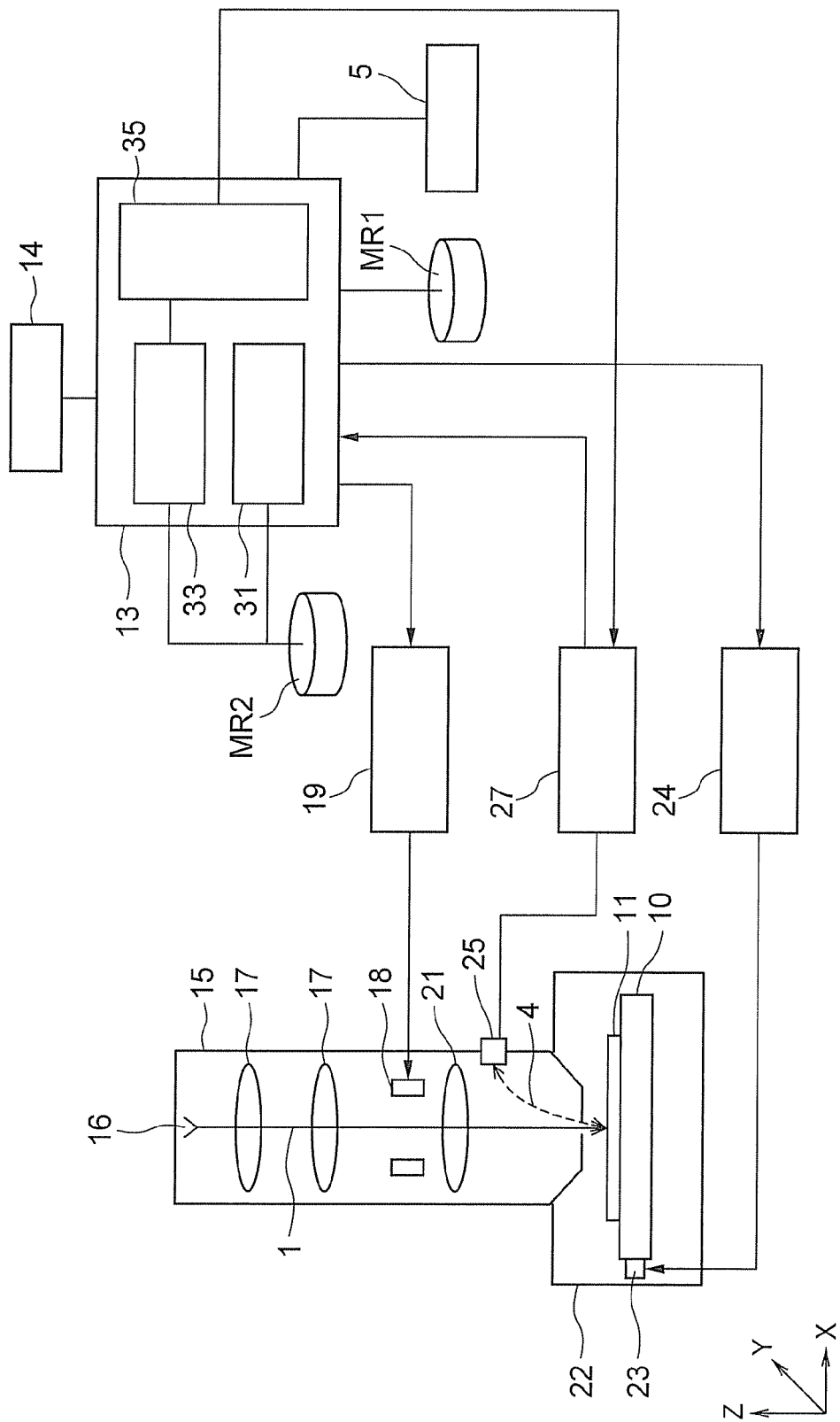
FIG. 1 is a block diagram showing a schematic configuration of an electron microscope according to an embodiment.

FIG. 1 is a block diagram showing a schematic configuration of an electron microscope according to Embodiment 1. The electron microscope shown in FIG. 1 includes an electron beam column 15, a sample chamber 22, a control computer 13, a deflection controller 19, an actuator controller 24, a signal processor 27, a monitor 14, an input section 5, and recording devices MR1 and MR2.

The electron beam column 15 is provided with an electron gun 16, a condenser lens 17, a deflector 18, an objective lens 21, and a detector 25.

A stage 10 supports a semiconductor wafer 11 having an inspection target pattern formed thereon, and an actuator 23 are provided in the sample chamber 22. In the present embodiment, the semiconductor wafer 11 corresponds to, for example, a sample. The sample is not limited to the semiconductor wafer, and may be, for example, a glass substrate or a ceramic substrate as long as the inspection target pattern is formed thereon. Moreover, the sample is not limited to a substrate as such, and may be a part extracted by breaking down the substrate as needed. On the semiconductor wafer 11, inspection target patterns of the same shape are formed on dies or cells at positions corresponding to each other. An image of these patterns is acquired as a sample image.

The control computer 13 is connected to the deflection control circuit 19, the signal processor 27, and the actuator controller 24. The deflection controller 19 is connected to the deflector 18 in the electron beam column 15. The actuator controller 24 is connected to the actuator 23 in the sample chamber 22. The signal processor 27 is connected to the detector 25. The computer 13 is also connected to the input section 5, the monitor 14, and the recording devices MR1 and MR2.

The recording device MR2 is configured to store later-described reference information as master data, and also temporarily store reference images, sample images, and actual data. The recording device MR2 is configured to further store sample images qualities of which have been adjusted by a data comparator 33, an image adjustment signal generator 35, and the signal processor 27.

An electron beam 1 emitted from the electron gun 16 is condensed by the condenser lens 17, and its focal position is then adjusted by the objective lens 21. The electron beam 1 is then applied to the semiconductor wafer 11. The deflection controller 19 generates a deflection control signal in accordance with the instruction from the control computer 13. The deflector 18 forms a deflection electric field or deflection magnetic field in accordance with the deflection control signal supplied from the deflection controller 19, and then properly deflects the electron beam 1 in an X-direction and a Y-direction to scan the surface of the semiconductor wafer 11. In response to the application of the electron beam 1, secondary electrons and reflected electrons 4 are generated from the surface of the semiconductor wafer 11 and detected by the detector 25, and a detection signal is then sent to the signal processor 27.

The stage 10 is movable in the X-direction and the Y-direction, and moves in the X-direction and the Y-direction when the actuator 23 is driven in accordance with a control signal which is generated by the actuator control circuit 24 in accordance with the instruction from the control computer 13. The stage 10 may be configured to be movable not only in an X-Y two-dimensional plane but also in a three-dimensional space in any of the X-, Y-, and Z-directions in conformity to the shape and layout form of the inspection target pattern. Moreover, the stage 10 may also be configured to be able to incline the wafer 11 at any angle of inclination.

The signal processor 27 processes the detection signal sent from the detector 25 to form SEM images (a reference image and a sample image) of the pattern on the surface of the semiconductor wafer 11, and supplies the SEM images to the control computer 13.

The control computer 13 includes a data acquiring section 31, the data comparator 33, and the image adjustment signal generator 35. The data acquiring section 31 is connected to the signal processor 27. The data acquiring section 31 displays the SEM images (the reference image and the sample image) by the monitor 14 when provided with these SEM images from the signal processor 27. The data acquiring section 31 also acquires a later-described background value and a luminance profile waveform.

Receiving the background value and the luminance profile waveform regarding the SEM images (the reference image and the sample image) from the data acquiring section 31, the data comparator 33 processes the background value and the luminance profile waveform into comparable forms, and then performs matching processing of the same. In the present embodiment, the data comparator 33 corresponds to, for example, a matching unit.

Receiving the result of the matching processing from the data comparator 33, the image adjustment signal generator 35 generates an image quality adjusting signal and supplies this signal to the signal processor 27. The image adjustment signal generator 35 can also generate an image quality adjustment signal in accordance with an instruction input by an operator through the input section 5, and supply this signal to the signal processor 27. The signal processor 27 which has received the image quality adjustment signal from the image adjustment signal generator 35 adjusts the quality of the sample image. In the present embodiment, the image adjustment signal generator 35 and the signal processor 27 correspond to, for example, an image adjusting unit, and the signal processor 27 also corresponds to, for example, an image generating unit.

The recording device MR1 is configured to store a recipe file in which a specific procedure of an image quality adjusting method that will be described below is written. The control computer 13 reads the recipe file from the recording device MR1, and then executes a series of procedures including the acquisition of the reference image, the acquisition of the reference information, the acquisition of the sample image, the acquisition of the actual data, the comparison of data (matching processing), and the adjustment of image quality.

(2) Image Quality Adjusting Method According to One Embodiment

The operation of the electron microscope shown in FIG. 1 is described with reference to FIG. 2 to FIG. 6B as one embodiment of the image quality adjusting method.

The schematic procedure of the image quality adjusting method according to the embodiment is initially described with reference to a flowchart in FIG. 2.

First, the operator adjusts the electron microscope to acquire, as a reference image, an SEM image having desired quality of the inspection target pattern on the semiconductor wafer 11. The data acquiring section 31 acquires reference information from the reference image and registers the reference information as reference information (step S10).

An SEM image is then acquired as a sample image regarding the inspection target pattern, and the data acquiring section 31 acquires actual data from the sample image (step S20).

The actual data is then matched with master data (step S30). More specifically, a command signal is generated in the data comparator 33 so that the SEM image at the time of the acquisition of the actual data closely resembles the reference image, and the command signal is supplied to the image adjustment signal generator 35. In response to this command signal, the image adjustment signal generator 35 generates an image quality adjustment signal (brightness, contrast), and supplies this signal to the signal processor 27 to adjust the brightness and the contrast.

If the operator approves the conformity between the actual data and the master data after the adjustment of image quality (Yes in step S40), the SEM image is registered in the recording device MR2 as an inspection image (step S100). If the operator cannot approve (No in step S40), the operator inputs, via the input section 5, parameters necessary for the image quality adjustment to the image adjustment signal generator 35. The image adjustment signal generator 35 generates a command signal and supplies the command signal to the signal processor 27, and the signal processor 27 adjusts the image quality (step S50). The data acquiring section 31 again acquires actual data from the sample image of the inspection target pattern (step S60). The new actual data is matched with the master data (step S70). If the operator approves the conformity (Yes in step S80), the SEM image is registered in the recording device MR2 as an inspection image (step S100). If the operator cannot approve the conformity (No in step S80), the processing from step S50 to step S80 can be repeated to optimize the image quality adjustment until the operator can approve the conformity, or the processing can be stopped (step S90).

Now, a specific method of registering the master data is described with reference to a flowchart in FIG. 3 and to FIGS. 4A and 4B.

First, the semiconductor wafer 11 is prepared as a sample (step S11), and is set on the stage 10 (step S12).

The electron beam 1 is then generated from the electron gun 16 and applied to the semiconductor wafer 11, and an SEM image as a reference image is acquired regarding the inspection target pattern (step S13). In this case, the electron microscope is adjusted to obtain optimum brightness and contrast whereby a desired part to be analyzed in the inspection target pattern reflects the intention of an analyzer. An example of the reference image thus obtained is shown by an image Img1 in FIG. 4A.

Viewing the monitor 14, the operator then sets, via the input section 5, a standard region to acquire a gray-scale value serving in the reference image as a standard for brightness comparison with other SEM images (see step S14). A gray-scale value of one part in the reference image is not set, but the standard region having a predetermined area is set for the following reasons. The SEM image has black-and-white information for each pixel, and this information becomes a region to represent gray scale. Therefore, a gray-scale value only obtained from a pixel in one part lacks reproducibility between this SEM image and other SEM images. Thus, in order to ensure reproducibility, a predetermined acquisition region width (an X pixel and a Y pixel) is provided around a specified part, and the average of all the pixels in this region is calculated and used as a standard gray-scale value of the reference image.

As a standard region for the gray-scale value, an imaging region of a part made of a uniform material among a plurality of SEM images, or a common region having no material is selected. The part made of the same material is typically a silicon substrate. The common region having no material is typically a background region. In the present embodiment, the background region is used as the standard region (step S14). For example, in the image Img1 in FIG. 4A, a region indicated by the sign RG1 corresponds to the standard region for the gray-scale value to be a comparison standard. In the present embodiment, the standard region RG1 corresponds to, for example, a first region.

Viewing the monitor 14, the operator then sets, via the input section 5, a region to acquire a luminance profile waveform in the reference image (see step S15). The luminance profile waveform acquisition region includes an edge of the pattern. For example, in the image Img1 in FIG. 4A, a region indicated by the sign RG3 corresponds to the luminance profile waveform acquisition region. This region preferably includes an inspection target part. In the present embodiment, the luminance profile waveform acquisition region RG3 corresponds to, for example, a second region.

Furthermore, the data acquiring section 31 calculates the average of all the pixels in the standard region RG1, and defines the obtained value as a standard background value. The data acquiring section 31 also acquires a luminance profile waveform of the region RG3, and defines this waveform as a standard luminance profile waveform. The standard background value and the standard luminance profile waveform are registered in the recording device MR2 as master data (step S16). Examples of the standard background value and the standard luminance profile waveform obtained regarding the region RG3 in the image Img1 are shown by the signs GS1 and PF1 in FIG. 4B.

Figure 5:
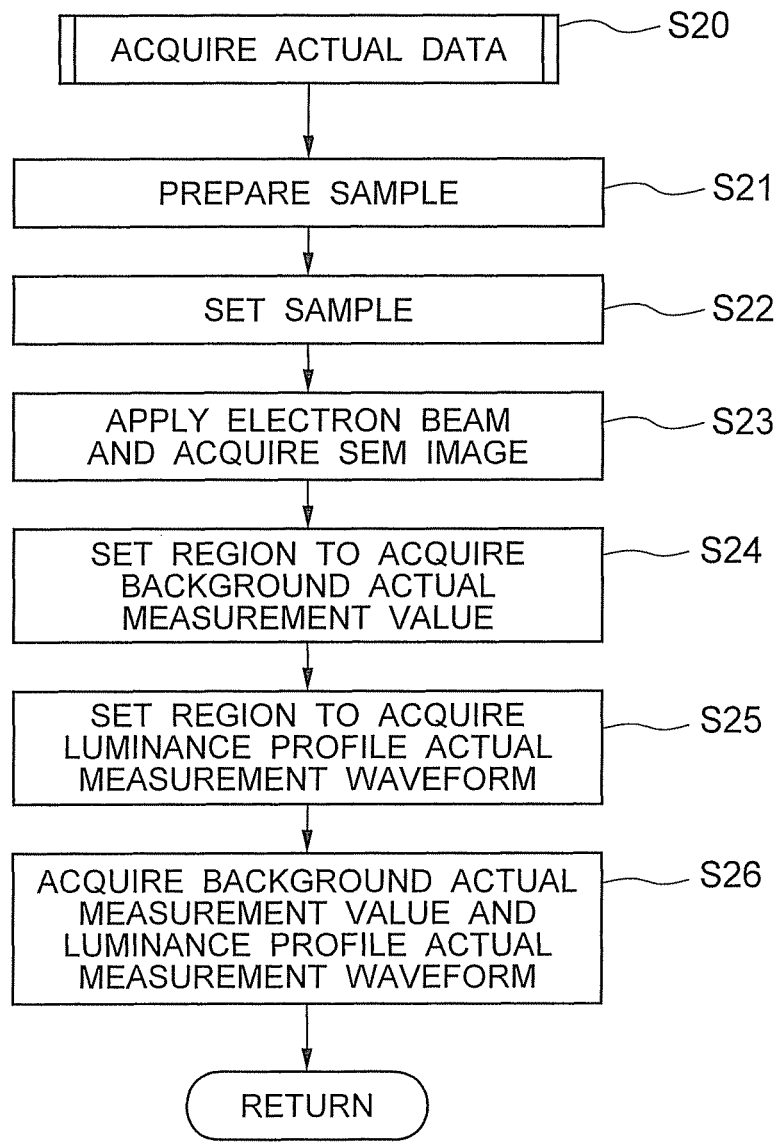
FIG. 5 is a flowchart showing a specific procedure of actual data acquisition out of the procedure in FIG. 2.
Figure 6A:
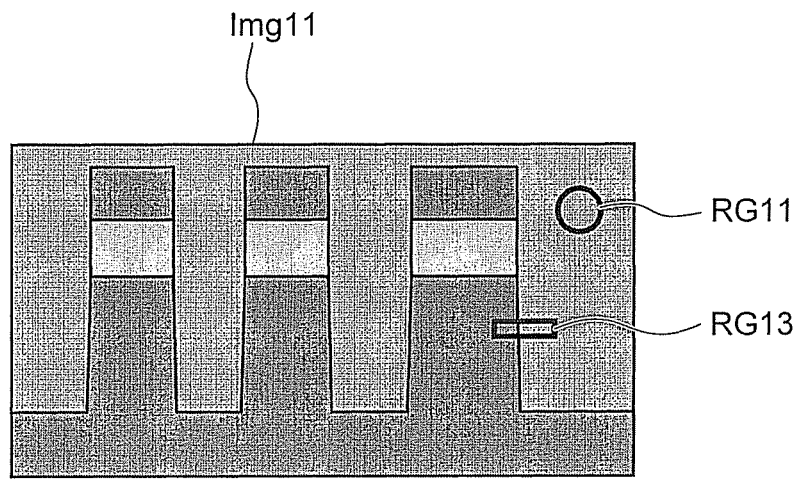
FIGS. 6A and 6B are views illustrating the procedure shown in FIG. 5.
Figure 6B:
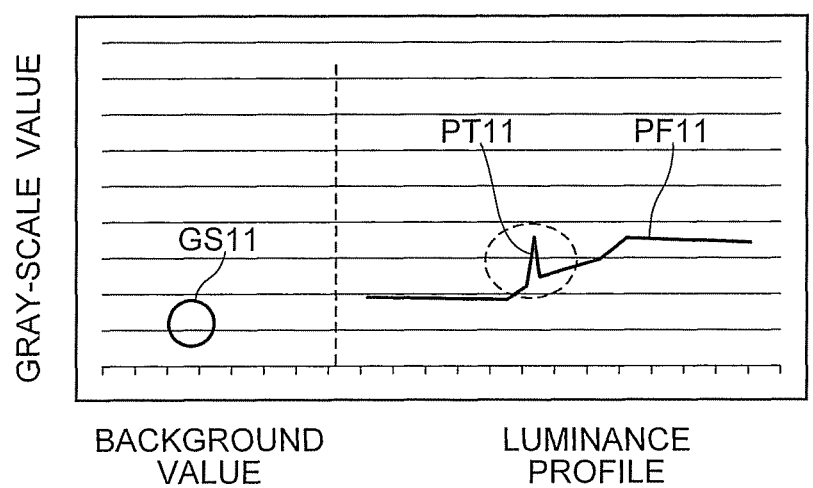

Now, a method of acquiring the actual data is described with reference to a flowchart in FIG. 5 and to FIGS. 6A and 6B.

Figure 3:
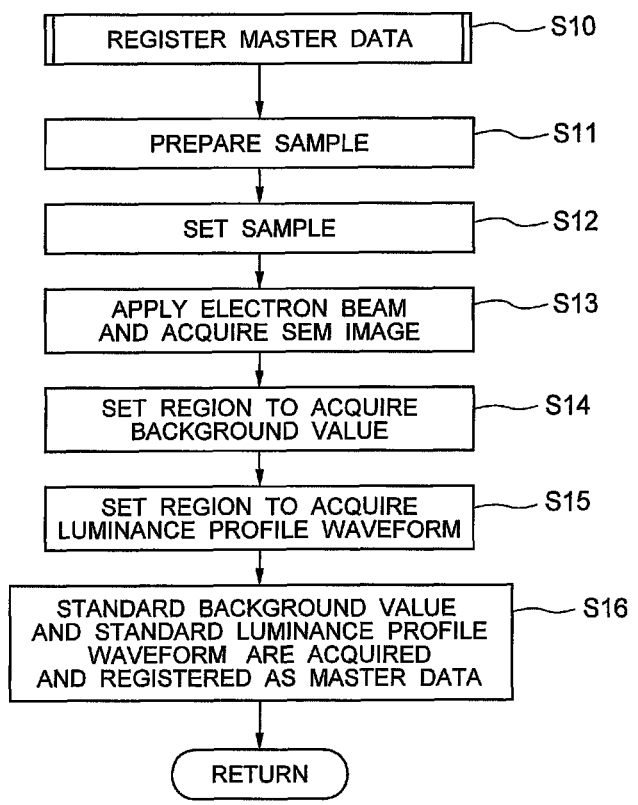
FIG. 3 is a flowchart showing a specific procedure of master data registration out of the procedure in FIG. 2.
Figure 4A:
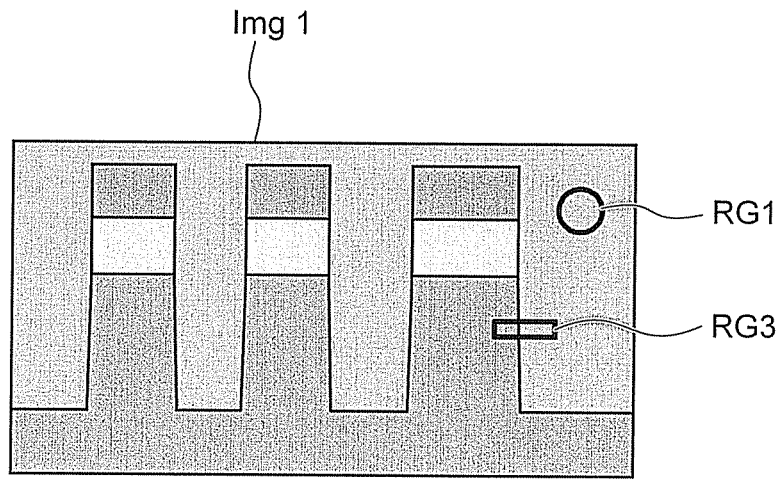
FIGS. 4A and 4B are views illustrating the procedure shown in FIG. 3.
Figure 4B:
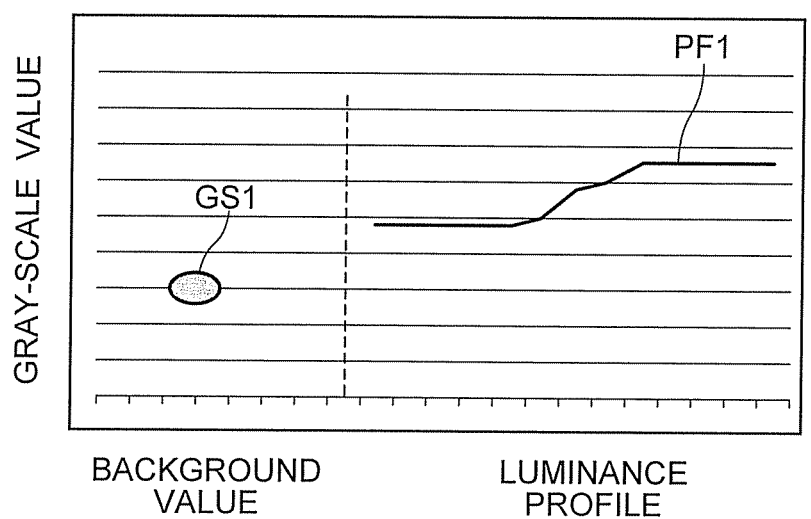

First, as common with the steps 11 and 12 shown in FIG. 3, the semiconductor wafer 11 is prepared as a sample (step S21), and is set on the stage 10 (step S22).

The electron beam 1 is then generated from the electron gun 16 and applied to the semiconductor wafer 11, and an SEM image as a sample image is acquired regarding the inspection target pattern (step S23).

Viewing the monitor 14, the operator then sets, via the input section 5, a region to acquire a background value corresponding to the standard region of the reference image in the sample image (see step S24). An example of the set background region is shown in a region indicated by the sign RG11 in an image Img11 in FIG. 6A. The region indicated by the sign RG11 corresponds to, for example to a third region.

Viewing the monitor 14, the operator then sets, via the input section 5, a region to acquire a luminance profile actual measurement waveform in the sample image (see step S25). As the reference image, the luminance profile actual measurement waveform acquisition region in the sample image also includes an edge of the pattern. For example, in the image Img11 in FIG. 6A, a region indicated by the sign RG13 corresponds to the luminance profile actual measurement waveform acquisition region. This region also preferably includes an inspection target part. The region indicated by the sign RG13 corresponds to, for example to a fourth region.

Furthermore, the data acquiring section 31 calculates the average of all the pixels in the background region RG11 in the sample image, and defines the obtained value as a background actual measurement value. The data acquiring section 31 also acquires a luminance profile actual measurement waveform of the region RG11. The background actual measurement value and the luminance profile actual measurement waveform are registered in the recording device MR2 as actual data (step S26). Examples of the background actual measurement value and the luminance profile actual measurement waveform obtained regarding the region RG13 in the image Img11 are shown by the signs GS11 and PF11 in FIG. 6B. The luminance profile actual measurement waveform PF11 shown in FIG. 6B includes a sharp projection PT11 where a rapid change of contrast is found.

A specific procedure of matching the actual data with the master data is then described with reference to FIGS. 7A and 7B.

Figure 7A:
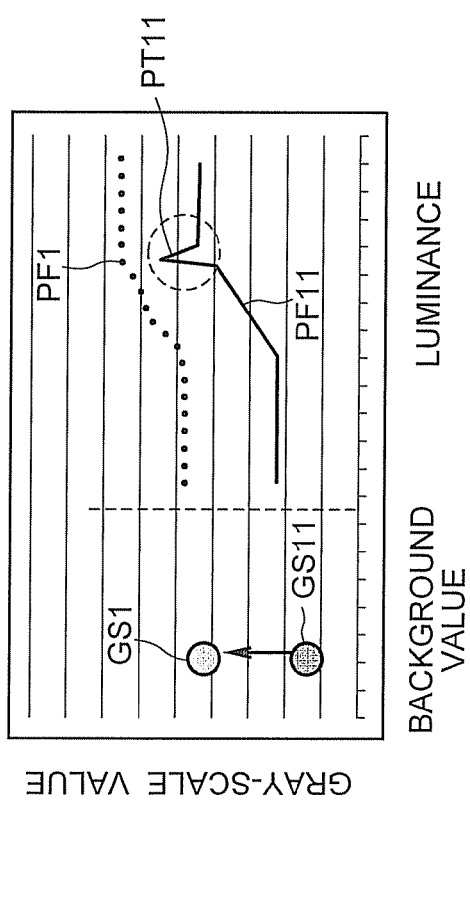
FIGS. 7A and 7B are views illustrating a procedure of matching in FIG. 2.
Figure 7B:
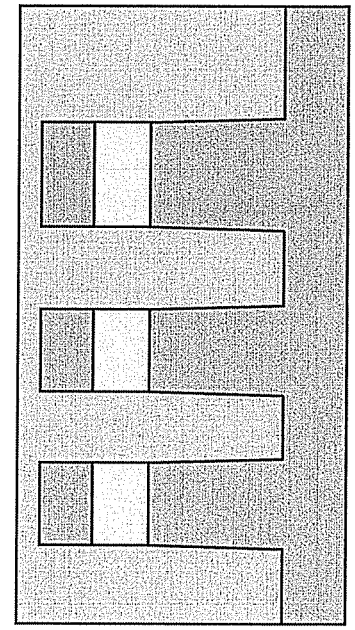
Figure 7B:
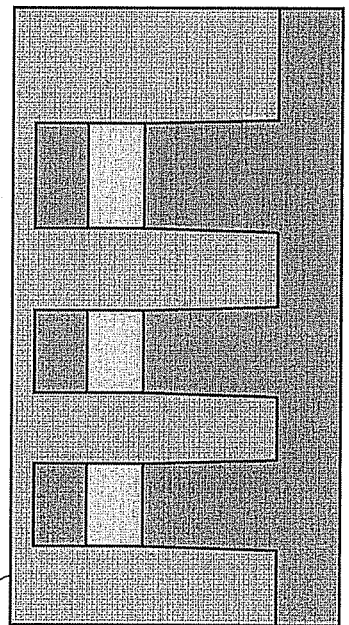

The data comparator 33 extracts, from the recording device MR2, the master data and the actual data, that is, the standard background value and the background actual measurement value as well as the standard luminance profile waveform and the luminance profile actual measurement waveform, which are displayed on the same plots, as shown in FIG. 7A.

Figure 2:
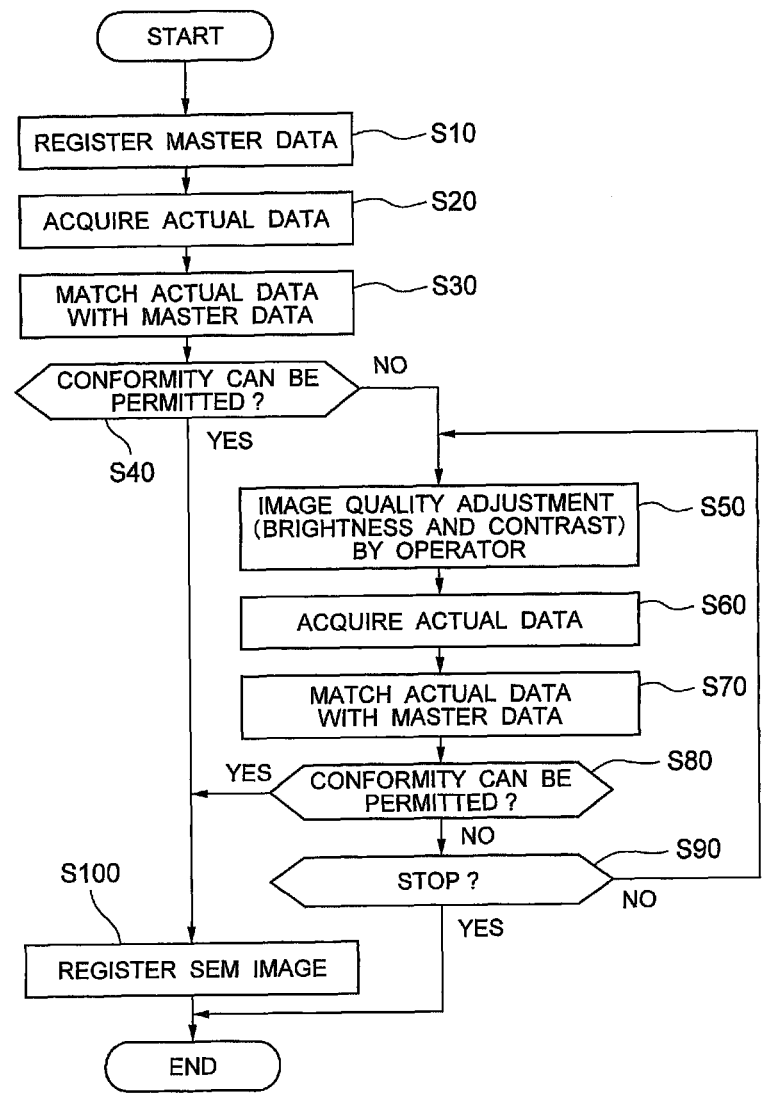
FIG. 2 is a flowchart showing a schematic procedure of an image quality adjusting method according to an embodiment.

The actual data is matched with the master data to adjust the image quality (FIG. 2, step S30).

As a matching procedure, a command signal is first supplied to the image adjustment signal generator 35 from the data comparator 33 so that the difference between the background actual measurement value GS11 of the sample image and the standard background GS1 of the reference image will be substantially zero. Thus, a brightness adjustment signal is generated.

A command signal is then supplied to the image adjustment signal generator 35 from the data comparator 33 so that the luminance profile actual measurement waveform PF11 will approach the standard luminance profile waveform PF1. Thus, a contrast adjustment signal is generated to adjust the image quality. As a result of the operation described above, the brightness and contrast of the sample image closely resembles the reference image, as shown in FIG. 7B. If the operator can permit this quality-adjusted sample image as an inspection image (FIG. 2, Yes in step S40), the sample image is registered and stored in the recording device MR2 (FIG. 2, steps S40 and S100). On the other hand, if the operator cannot permit the adjusted image (FIG. 2, No in step S40), the image adjustment signal generator 35 generates a command signal and supplies the command signal to the signal processor 27 in accordance with an instruction input to the input section 5 by the operator, and the signal processor 27 performs image adjusting processing (FIG. 2, step S50). The actual data for the acquired image (FIG. 2, step S60) and the data for the reference image are displayed on the unified plots as shown in FIG. 7A, and the operator judges the conformity with the reference image by the plotted information and the adjusted image (FIG. 2, step S70). If the adjusted image can be permitted, the adjusted image is registered and stored in the recording device MR2 (FIG. 2, Yes in step S80 and step S100). If the adjusted image cannot be permitted (FIG. 2, No in step S80), the above-described processing (step S50 to step S80) can be repeated to optimize the adjustment, or can be stopped (FIG. 2, step S90).

A series of procedures described above from the acquisition of the actual data (FIG. 2, step S20) to the registration of the inspection image (FIG. 2, step S100) is carried out for all the samples (inspection target patterns). Consequently, a series of inspection images is acquired.

A series of acquired inspection images is then passed to a process of pattern length measurement, and, for example, the dimensions are measured by an automatic length measurement algorithm.

According to the image quality adjusting method in at least one embodiment described above, the brightness and contrast of the sample image are adjusted by matching the sample image with the reference image regarding a pixel value in the first region within the pattern background or within the substrate in which the pattern is provided and regarding the luminance profile waveform in the second region including the pattern edge. Therefore, a sample image closely resembling the reference image in brightness and contrast can be acquired. Thus, once an algorithm to detect the boundary of the structure is determined in the reference image, the boundary of the structure can be detected in the sample image by the same algorithm. As a result, the automatic length measurement algorithm can be simplified, and the operator is freed from the manual measurement of, for example, the dimensions, and moreover, factors that might cause human errors when the operator determines a measurement point are eliminated.

Furthermore, it is possible to provide a measurement environment where a large quantity of measurement is allowed by the automatic length measurement. That is, the automation of length measurement can be drastically developed, and the burden on the operator can be reduced.

Similarly, according to the electron microscope in at least one embodiment described above, the image quality adjusting unit is provided to adjust the brightness and contrast of the sample image by matching the sample image with the reference image regarding a pixel value in the first region within the pattern background or within the substrate in which the pattern is provided and regarding the luminance profile waveform in the second region including the pattern edge. Therefore, a sample image closely resembling the reference image in brightness and contrast can be provided. Thus, it is possible to provide a measurement environment where a large quantity of measurement is allowed by the automatic length measurement.

(3) Program and Recording Medium

A series of procedures of the image quality adjustment described above may be incorporated in a program, and read into and executed by a control computer of the electron microscope. This enables the image quality adjustment described above to be carried out by use of a general-purpose electron microscope. A series of procedures of the image quality adjustment described above may be stored in a recording medium such as a flexible disk or a CD-ROM as a program to be executed by the control computer of the electron microscope, and read into and executed by the control computer.

The recording medium is not limited to a portable medium such as a magnetic disk or an optical disk, and may be a fixed recording medium such as a hard disk drive or a memory. The program incorporating the series of procedures of the image quality adjustment described above may be distributed via a communication line (including wireless communication) such as the Internet. Moreover, the program incorporating the series of procedures of the simulation image quality adjustment above may be distributed in an encrypted, modulated or compressed state via a wired line or a wireless line such as the Internet or in a manner stored in a recording medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A method of adjusting quality of an image of a plurality of patterns common in shape, the method comprising:
    acquiring a first gray value to be a standard for brightness of the image from a first region within a reference image, and a first waveform representing a luminance profile of a second region comprising an edge within the reference image;
    applying an electron beam to a sample comprising patterns common in shape to detect secondary electrons and reflected electrons generated from the sample and thereby acquiring a sample image;
    acquiring a second gray value and a second waveform representing a luminance profile from third and fourth regions within the sample image, respectively, the third and fourth regions corresponding to the first and second regions; and
    matching the first gray value and the first waveform with the second gray value and the second waveform to adjust brightness and contrast of the sample image.

2. The method of claim 1,
    wherein a procedure from the acquisition of the sample image to the matching is repeated until a desired image quality is obtained.

3. The method of claim 2,
    wherein the brightness of the sample image is adjusted in accordance with the first pixel value and the second pixel value.

4. The method of claim 2,
    wherein the contrast of the sample image is adjusted in accordance with the difference between the first waveform and the second waveform.

5. The method of claim 1,
    wherein the first region is selected from an imaging region of a part made of the same material among a plurality of images.

6. The method of claim 5,
    wherein the patterns are formed on a substrate, and the part made of the same material is the substrate.

7. The method of claim 1,
    wherein the first region is selected from a common region having no material among a plurality of images.

8. The method of claim 7,
    wherein the common region having no material is a background region.

9. The method of claim 1,
    wherein the second region comprises an inspection target part in the pattern.

10. A non-transitory computer readable recording medium containing a program which causes a computer to execute adjusting quality of an image of a plurality of patterns common in shape, the computer controlling an electron microscope configured to apply an electron beam to a sample and acquire an image of the sample, the adjusting the quality of the image comprising:

acquiring a first gray value to be a standard for brightness of the image from a first region within a reference image, and a first waveform representing a luminance profile of a second region comprising an edge within the reference image;

applying an electron beam to a sample comprising patterns common in shape to detect secondary electrons and reflected electrons generated from the sample and thereby acquiring a sample image;

acquiring a second gray value and a second waveform representing a luminance profile from third and fourth regions within the sample image, respectively, the third and fourth regions corresponding to the first and second regions; and matching the first gray value and the first waveform with the second gray value and the second waveform to adjust brightness and contrast of the sample image.

11. The medium of claim 10,
wherein a procedure from the acquisition of the sample image to the matching is repeated until a desired image quality is obtained.

12. The medium of claim 11,
wherein the brightness of the sample image is adjusted in accordance with the first pixel value and the second pixel value.

13. The medium of claim 11,
wherein the contrast of the sample image is adjusted in accordance with the difference between the first waveform and the second waveform.

14. The medium of claim 10,
wherein the first region is selected from an imaging region of a part made of the same material among a plurality of images.

15. The medium of claim 14,
wherein the patterns are formed on a substrate, and the part made of the same material is the substrate.

16. The medium of claim 10,
wherein the first region is selected from a common region having no material among a plurality of images.

17. The medium of claim 16,
wherein the common region having no material is a background region.

18. The medium of claim 10,
wherein the second region comprises an inspection target part in the pattern.

19. An electron microscope comprising:
an electron gun configured to apply an electron beam to a sample;
a detector configured to detect secondary electrons and reflected electrons generated from the sample by the application of the electron beam and to output a signal;
an image generating unit configured to process the signal to generate an image of the sample;
a data acquiring unit configured to acquire, on receipt of a reference image, a first pixel value to be a brightness standard from a first region within the reference image, and a first waveform representing a luminance profile of a second region comprising an edge within the reference image, acquire a second pixel value from a third region corresponding to the first region within the sample image, and acquire a second waveform representing a luminance profile of a fourth region corresponding to the second region within the sample image;
a matching unit configured to match the first pixel value and the first waveform with the second pixel value and the second waveform; and
an image adjusting unit configured to adjust brightness and contrast of the sample image in accordance with the result of matching by the matching unit.

20. The electron microscope of claim 19,
wherein the image adjusting unit adjusts the brightness of the sample image in accordance with the difference between the first pixel value and the second pixel value, and adjusts the contrast of the sample image in accordance with the difference between the first waveform and the second waveform.

* * * * *